United States Patent
Lo et al.

(10) Patent No.: US 11,217,487 B2
(45) Date of Patent: Jan. 4, 2022

(54) SEMICONDUCTOR ARRANGEMENT AND METHOD OF MANUFACTURE

(71) Applicant: TAIWAN SEMICONDUCTOR MANUFACTURING COMPANY LIMITED, Hsin-Chu (TW)

(72) Inventors: Yi-Chen Lo, Zhubei (TW); Li-Te Lin, Hsinchu (TW); Pinyen Lin, Rochester, NY (US)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/687,999

(22) Filed: Nov. 19, 2019

(65) Prior Publication Data
US 2020/0176323 A1    Jun. 4, 2020

Related U.S. Application Data

(60) Provisional application No. 62/773,321, filed on Nov. 30, 2018.

(51) Int. Cl.
*H01L 21/8234* (2006.01)
*H01L 29/66* (2006.01)
*H01L 21/3213* (2006.01)
*H01L 21/02* (2006.01)
*H01L 21/28* (2006.01)

(52) U.S. Cl.
CPC ........... *H01L 21/823456* (2013.01); *H01L 21/02118* (2013.01); *H01L 21/02274* (2013.01); *H01L 21/28088* (2013.01); *H01L 21/32136* (2013.01); *H01L 21/32138* (2013.01); *H01L 21/823431* (2013.01); *H01L 29/66545* (2013.01)

(58) Field of Classification Search
CPC ......... H01L 29/78391; H01L 21/28185; H01L 21/823412; H01L 21/823418; H01L 21/823437; H01L 27/088; H01L 29/513; H01L 29/516; H01L 29/517; H01L 29/6684
See application file for complete search history.

(56) References Cited

U.S. PATENT DOCUMENTS

| 4,030,967 A * | 6/1977 | Ingrey ................. C23F 4/00 216/67 |
| 2009/0035944 A1* | 2/2009 | Chiang ........... H01L 21/0338 438/703 |
| 2019/0288114 A1* | 9/2019 | Kim ................ H01L 21/823821 |

* cited by examiner

*Primary Examiner* — Zandra V Smith
*Assistant Examiner* — Andre C Stevenson
(74) *Attorney, Agent, or Firm* — Cooper Legal Group, LLC

(57) ABSTRACT

A method for forming a semiconductor arrangement includes forming a first gate structure over a first active region. The first gate structure includes a first conductive layer. An etch process is performed using a process gas mixture to recess the first gate structure and define a recess. The etch process comprises a first phase to form a polymer layer over the first conductive layer and to modify a portion of the first conductive layer to form a modified portion of the first conductive layer and a second phase to remove the polymer layer and to remove the modified portion of the first conductive layer.

20 Claims, 15 Drawing Sheets

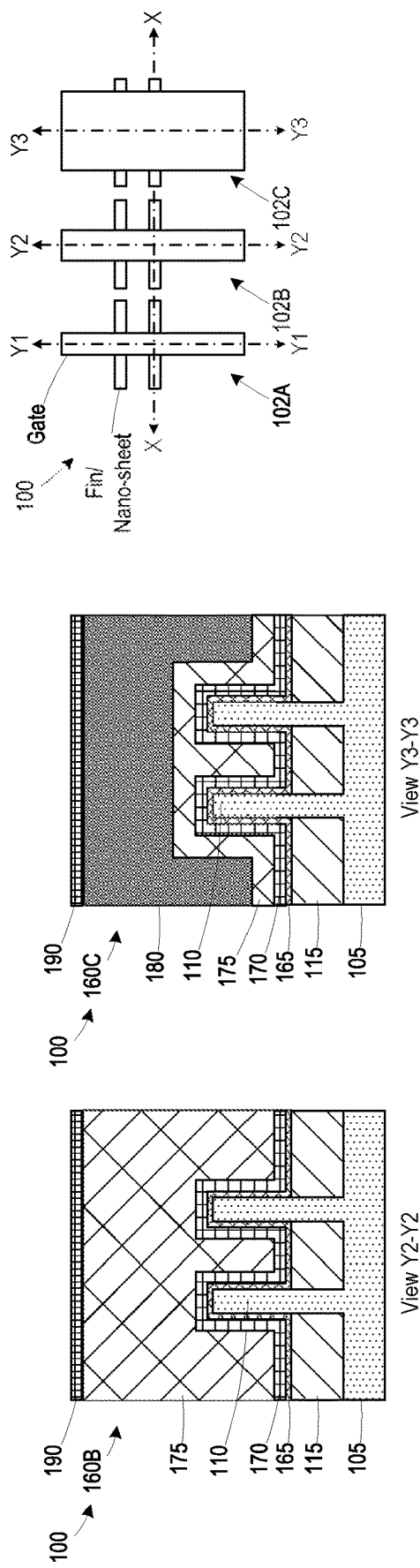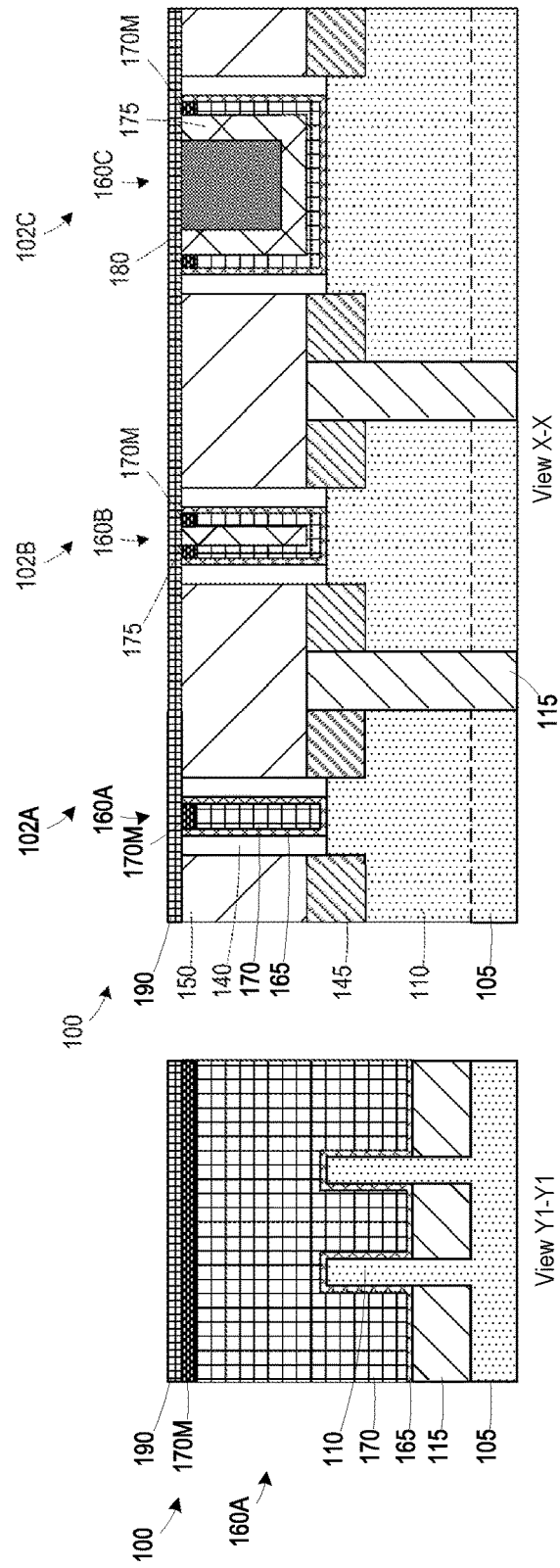
Figure 8

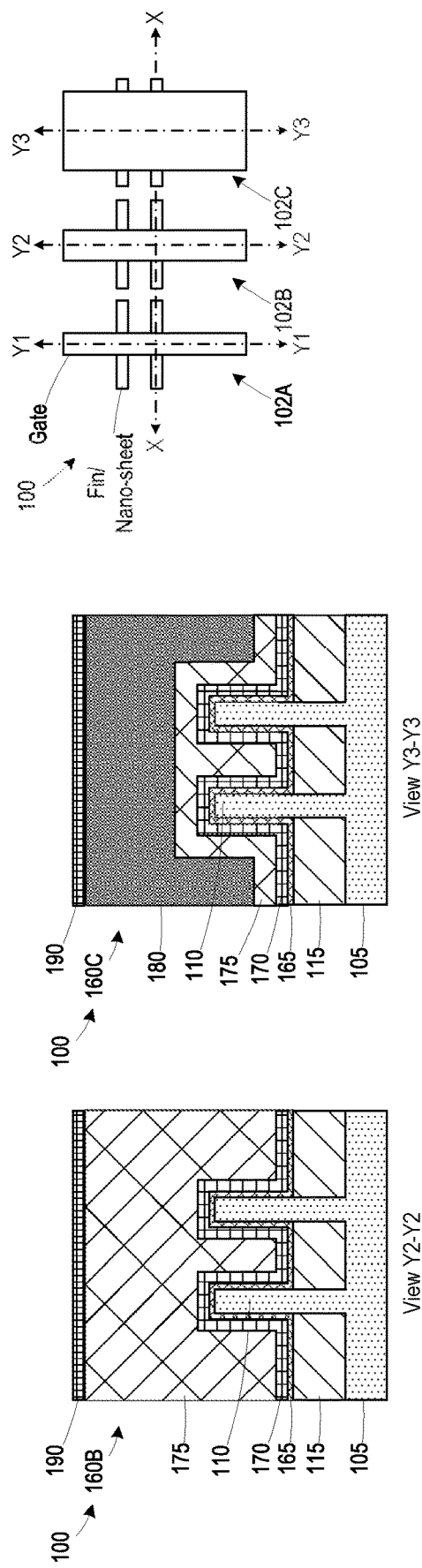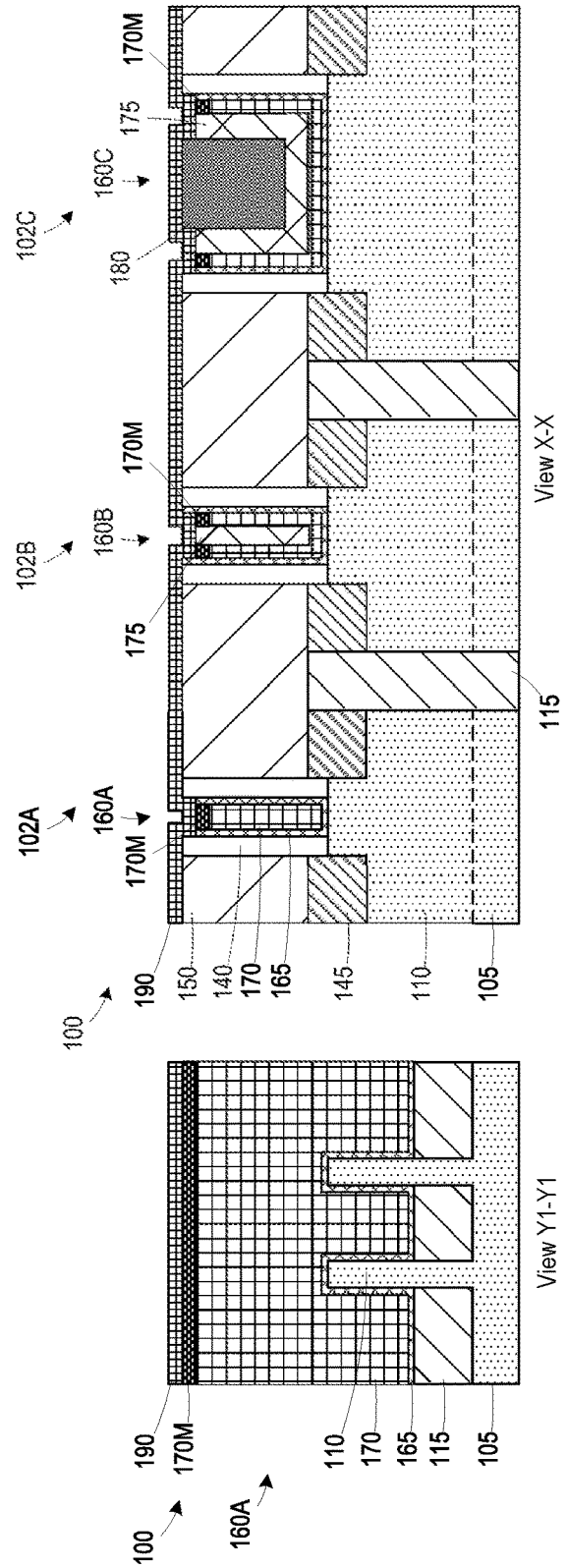
Figure 10

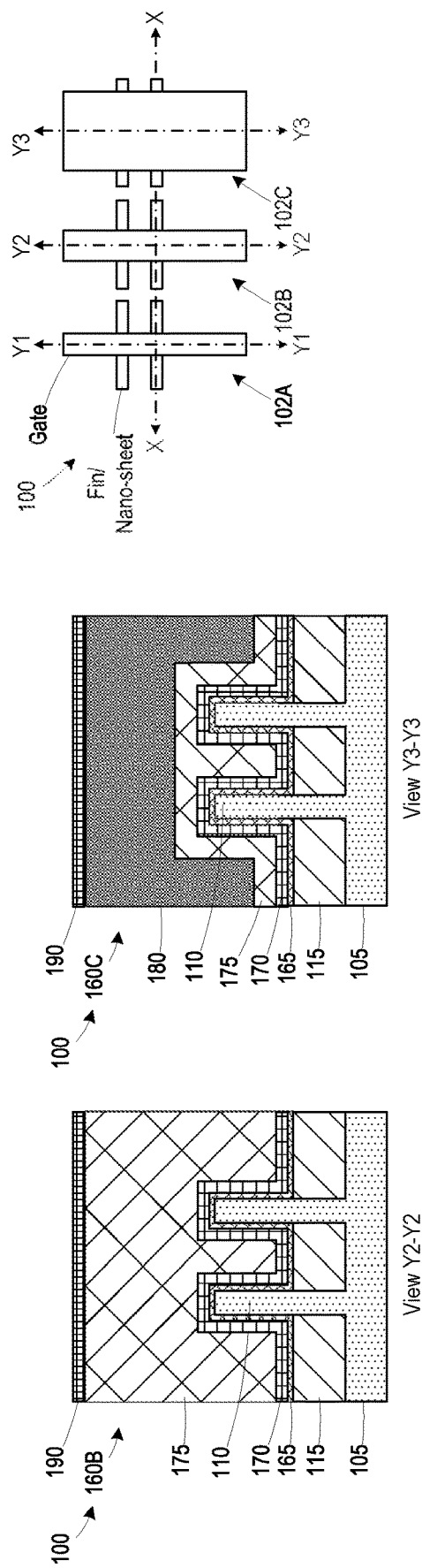
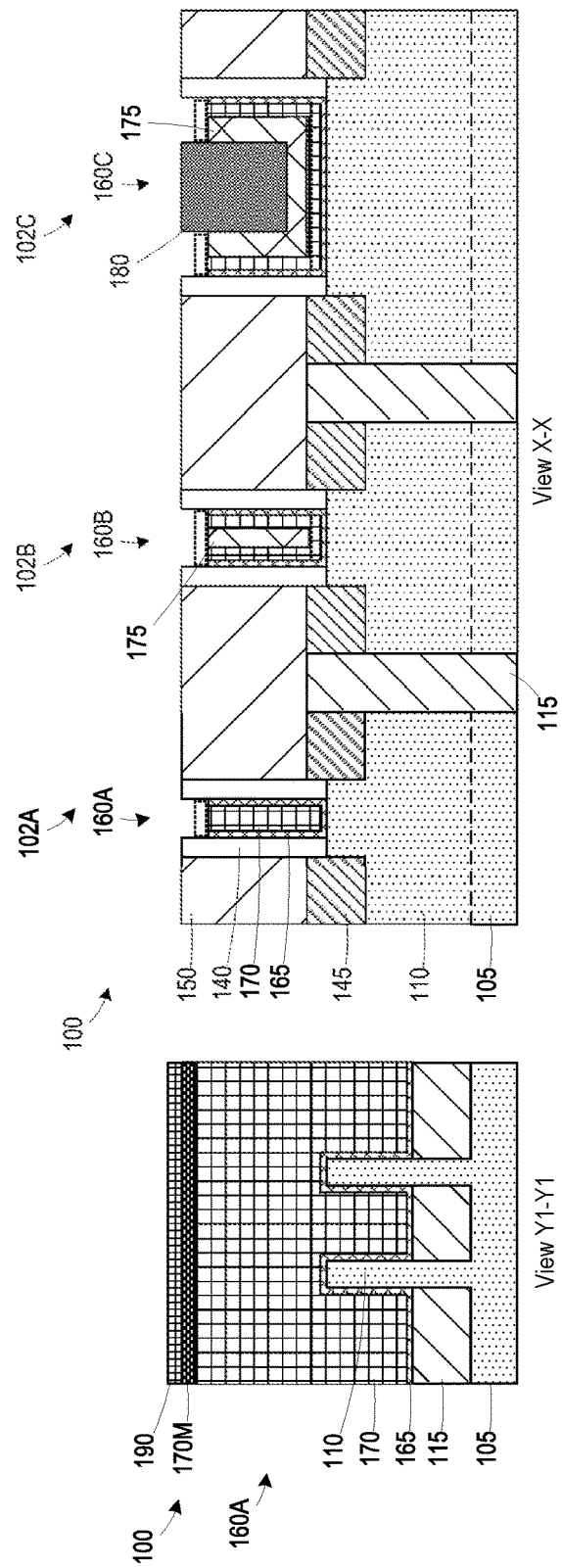
Figure 11

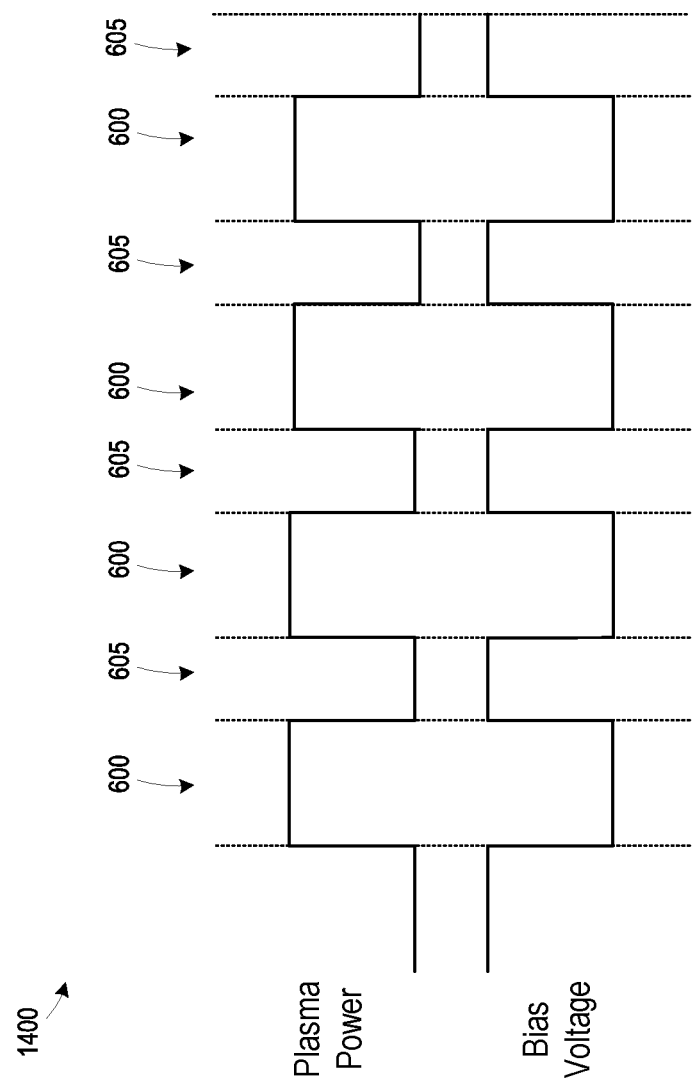

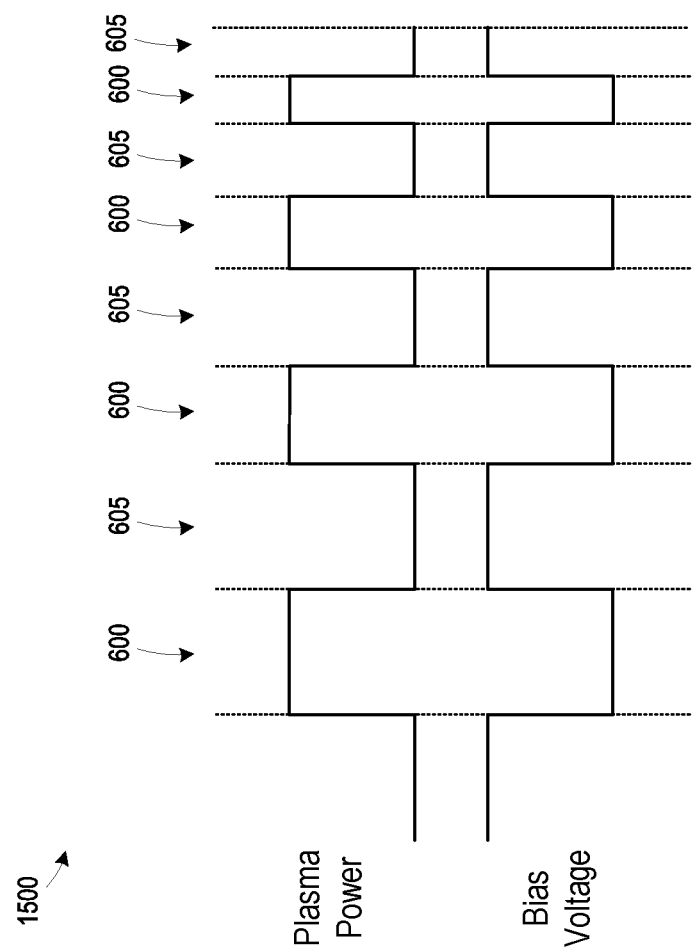

SEMICONDUCTOR ARRANGEMENT AND METHOD OF MANUFACTURE

RELATED APPLICATION

This application claims priority to U.S. Provisional Application Ser. No. 62/773,321, titled "SEMICONDUCTOR ARRANGEMENT AND METHOD OF MANUFACTURE" and filed on Nov. 30, 2018, which is incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET) and gate all around (GAA) transistors. A FinFET comprises an extended semiconductor fin that is elevated over a substrate in a direction substantially normal to a plane of a top surface of the substrate. A channel of the FinFET is formed in the fin. A gate is provided over and partially wraps the fin. A GAA transistor comprises one or more nano-sheet channel regions having a gate wrapped around the nano-sheet. FinFETs and GAA transistors can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6 and 8-12 are illustrations of a semiconductor arrangement at various stages of fabrication, in accordance with some embodiments.

FIG. 14 is a timing diagram of a cyclic etch process, in accordance with some embodiments.

FIG. 15 is a timing diagram of a cyclic etch process, in accordance with some embodiments.

DETAILED DESCRIPTION

Figure 1:
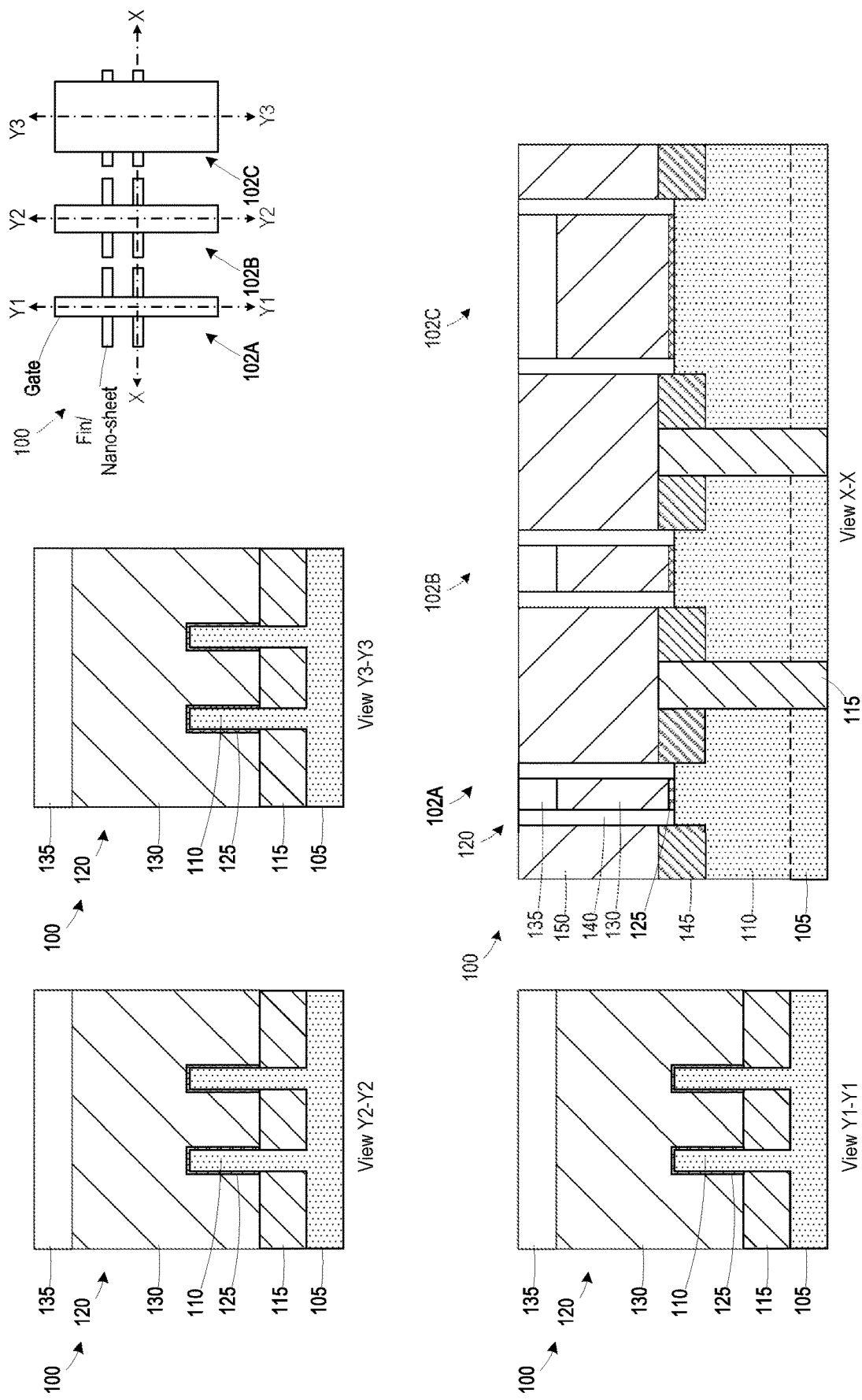

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. In some embodiments, gate structures comprising multiple layers are formed for devices having differing densities, and resulting gate lengths. In some embodiments, to improve etch uniformity of the recessing process across different gate widths, a cyclic etch process is performed to recess portions of the gate structure, thereby defining a recess. A dielectric cap layer is formed in the recess. In some embodiments, the gate structures comprise a gate dielectric layer and a work function material layer formed over the gate dielectric layer. In some embodiments, the gate structures comprise a conductive layer formed over the work function material layer. According to some embodiments, the cyclic etch process comprises a surface modification phase and a material removal phase. In some embodiments, the surface modification phase is performed in a plasma chamber using high plasma power and low bias voltage parameters. In some embodiments, a polymer layer is deposited during the surface modification phase, and surface portions of the work function material layer are modified. In some embodiments, the material removal phase removes the polymer layer and the surface portions of the work function material layer that were modified during the surface modification phase. In some embodiments, the material removal phase etches the gate dielectric layer and the conductive layer exposed by removal of the surface portions of the work function material layer. In some embodiments, the surface modification phase and the material removal phase use the same process gas mixture. According to some embodiments, the cyclic etch process reduces gate height loss and improves throughput.

FIGS. 1-6 and 8-12 are illustrations of a semiconductor arrangement 100 at various stages of fabrication, in accordance with some embodiments. FIGS. 1-6 and 8-12 include a plan view showing where various cross-sectional views are taken. Referring to FIG. 1, the view X-X is a cross-sectional view taken through the semiconductor arrangement 100 in a direction corresponding to a gate length direction through fins formed in different regions, and the views Y1-Y1, Y2-Y2, and Y3-Y3 are cross-sectional views taken through the semiconductor arrangement 100 in a direction corresponding to a gate width direction through gate structures. Not all aspects of the processing shown in the cross-sectional views will be depicted in the plan view. In some embodiments, the devices shown in view Y1-Y1 are formed in a first region 102A of the semiconductor arrangement 100, the devices shown in view Y2-Y2 are formed in a second region 102B, and the devices shown in view Y3-Y3 are formed in a third region 102C of the semiconductor arrangement 100.

According to some embodiments, the density of the particular region 102A, 102B, 102C defines the distance between adjacent gate structures and the critical dimension (CD) of each gate structure. The CD, in turn, defines the gate length of the gate structure, where the gate length generally represents the distance between source/drain regions of a transistor device formed in the particular region 102A, 102B, 102C. In some embodiments, the devices in the first region 102A have a first gate length, the devices in the second region have a second gate length different than the first gate length, and the devices in the third region 102C have a third gate length different than the first gate length and the second gate length. In some embodiments, the second gate length is greater than the first gate length, and the third gate length is greater than the second gate length. In some embodiments, the differing gate lengths represent regions of differing density or CDs.

Referring to FIG. 1, a plurality of layers used in the formation of the semiconductor arrangement 100 are illustrated, in accordance with some embodiments. In some embodiments, the semiconductor arrangement 100 comprises fin-based transistors, such as FinFET transistors. In some embodiments, the semiconductor arrangement comprises nano-sheet based transistors or gate-all-around (GAA) transistors. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon.

In some embodiments, fins 110 are formed from the semiconductor layer 105 by etching trenches in the semiconductor layer 105 using a patterned hard mask. Thus, the fins 110 are formed from a portion of the semiconductor layer 105 that remains between trenches. In some embodiments, a layer for forming the fins 110 is formed, such as grown, over the semiconductor layer 105. In some embodiments, initial fins formed in the semiconductor layer 105 are replaced. For example, initial fins are defined by forming trenches in the semiconductor layer 105. A dielectric layer is formed between the initial fins and planarized to expose upper surfaces of the initial fins. An etch process is performed to remove at least portions of the initial fins, and a growth process is performed to form replacement fins with one or more different material characteristics compared to the initial fins, such as a different silicon alloy material, a different dopant concentration, etc. In general, the fins 110 define an active region for forming devices, such as FinFET transistors. In some embodiments, an isolation structure 115, such as shallow trench isolation (STI), is formed between the fins 110. In some embodiments, the isolation structure 115 is formed by depositing a dielectric layer between the fins 110 and recessing the dielectric layer to expose at least portions of the sidewalls of the fins 110 that were concealed when the dielectric layer was deposited. In some embodiments, the isolation structure 115 comprises silicon and oxygen or other suitable materials. In some embodiments, the isolation structure 115 defines the regions 102A, 102B, 102C.

In some embodiments, sacrificial gate structures 120 are formed over the fins 110 and over the isolation structure 115. In some embodiments, the sacrificial gate structures 120 comprise a first gate dielectric layer 125 and a sacrificial gate electrode 130. In some embodiments, the first gate dielectric layer 125 comprises a high-k dielectric material. As used herein, the term "high-k dielectric material" refers to a material having a dielectric constant, k, greater than or equal to about 3.9, which is the k value of SiO2. The material of the high-k dielectric layer may be any suitable material. Examples of the material of the high-k dielectric layer include but are not limited to $Al_2O_3$, $HfO_2$, $ZrO_2$, $La_2O_3$, $TlO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, a silicate thereof, or an alloy thereof. Each value of x is independently from 0.5 to 3, and each value of y is independently from 0 to 2. In some embodiments, the first gate dielectric layer 125 comprises a native oxide layer formed by exposure of the semiconductor arrangement 100 to oxygen at various points in the process flow, causing the formation of silicon dioxide on exposed surfaces of the fins 110. In some embodiments, an additional layer of dielectric material, such as silicon dioxide or other suitable material, is formed over the native oxide to form the first gate dielectric layer 125. In some embodiments, the sacrificial gate electrode 130 comprises polysilicon.

According to some embodiments, the sacrificial gate structures 120 are formed by forming a layer of sacrificial material and a hard mask layer over the fins 110 and the isolation structure 115. In some embodiments, a patterning process is performed to pattern the hard mask layer corresponding to the pattern of gate structures to be formed, and an etch process is performed using the patterned hard mask layer to etch the sacrificial layer to define the sacrificial gate electrode 130. In some embodiments, remaining portions of the hard mask layer form cap layers 135 over the sacrificial gate electrode 130. In some embodiments, sidewall spacers 140 are formed adjacent the sacrificial gate structures 120. In some embodiments, the sidewall spacers 140 are formed by depositing a spacer layer over the sacrificial gate structures 120 and performing an etch process, such as an anisotropic etch process or other suitable etch process, to remove portions of the spacer layer positioned on horizontal surfaces of the cap layers 135, the fins 110, and the isolation structure 115. In some embodiments, the sidewall spacers 140 comprise the same material composition as the cap layers 135. In some embodiments, the sidewall spacers 140 comprise nitrogen and silicon or other suitable materials.

In some embodiments, source/drain regions 145 are formed in the fins 110 or over the fins after forming the sacrificial gate structures 120. In some embodiments, an etch process is performed to recess the fins 110 adjacent the sidewall spacers 140 and an epitaxial growth process is performed to form the source/drain regions 145. In some embodiments, the source/drain regions 145 are doped in situ during the epitaxial growth process. In some embodiments, the source/drain regions 145 are formed by implantation of dopants into the fins 110. In some embodiments, the source/drain regions 145 are raised source/drain regions having a height greater than a height of the fins 110. In some embodiments, the source/drain regions 145 between adjacent fins 110 merge during the epitaxial growth process to define merged source/drain regions. In some embodiments, the source/drain regions 145 comprise a different silicon alloy than the fins 110. For example, the fins 110 comprise silicon, and the source/drain regions 145 comprise silicon germanium, silicon tin, or another silicon alloy. In some embodiments, the source/drain regions 145 and the fins 110 are the same silicon alloy, but the concentration of the alloy material differs between the source/drain regions 145 and the fins 110. For example, a concentration of the alloy material in the source/drain regions 145 may be greater than a concentration of the alloy material in the fins 110.

In some embodiments, a dielectric layer 150 is formed over the fins 110 and adjacent the sacrificial gate structures 120. In some embodiments, a portion of the dielectric layer 150 is removed to expose the cap layers 135. In some embodiments, the dielectric layer 150 is planarized to expose the cap layers 135. In some embodiments, the dielectric layer 150 comprises silicon dioxide or a low-k material. In some embodiments, the dielectric layer 150 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. In some embodiments, the dielectric layer 150 comprise at least one of Si, O, C, or H, such as SiCOH and SiOC, or other suitable materials. In some embodiments, organic materials such as polymers are used for the dielectric layer 150. In some embodiments, the dielectric layer 150 comprises one or more layers of a carbon-containing material, organo-silicate glass, a porogen-containing material, or combinations thereof. In some embodiments, the dielectric layer 150 comprises nitrogen. In some embodiments, the dielectric layer 150 may be formed by using, for example, at least one of plasma-enhanced chemical vapor deposition (PECVD), low pressure CVD (LPCVD), atomic layer CVD (ALCVD), or a spin-on technology. In some embodiments where the dielectric layer 150 is formed using PECVD, the dielectric layer 150 is deposited at a substrate temperature in a range of about 25° C. to about 400° C. and at a pressure of less than 100 Torr.

Figure 2:
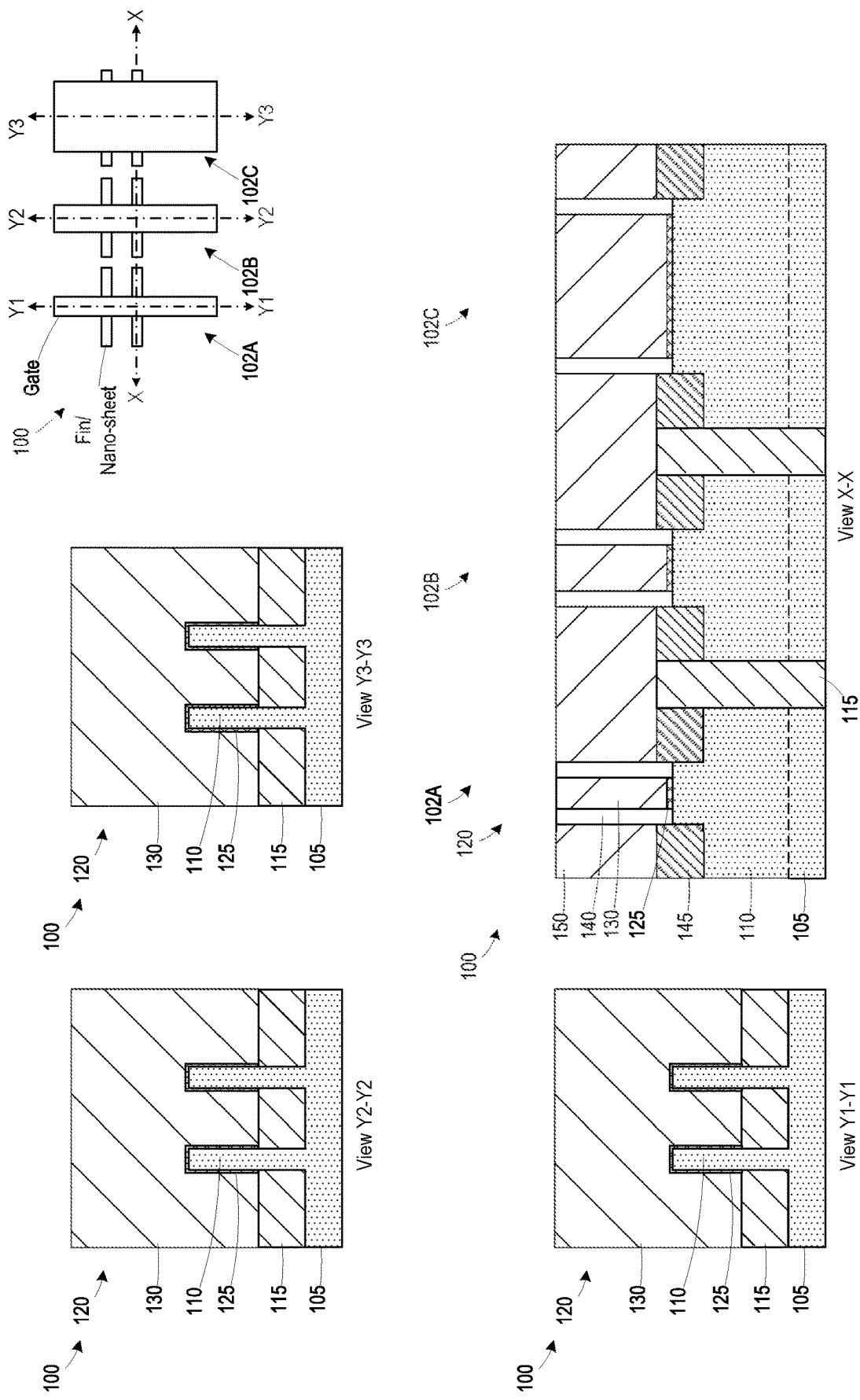

Referring to FIG. 2, the cap layers 135 are removed and heights of the sidewall spacers 140 and the dielectric layer 150 are reduced, in accordance with some embodiments. In some embodiments, a planarization process is performed to remove cap layers 135 and reduce the heights of the sidewall spacers 140 and the dielectric layer 150. In some embodiments, the planarization process exposes the sacrificial gate electrodes 130. In some embodiments, the planarization process is a continuation of the process performed to planarize the dielectric layer 150.

Figure 3:
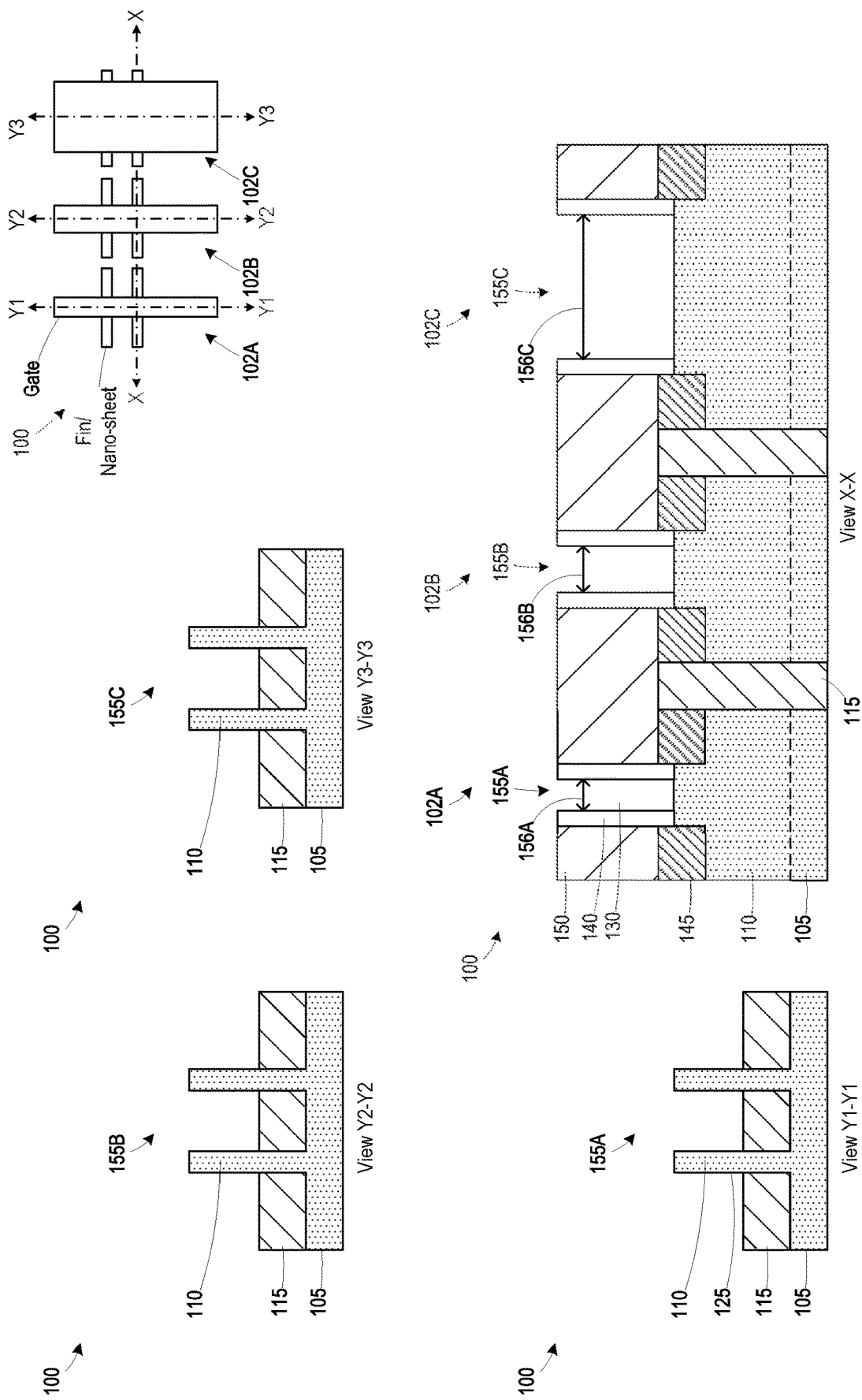

Referring to FIG. 3, the sacrificial gate electrodes 130 are removed to define gate cavities 155A, 155B, 155C, in accordance with some embodiments. In some embodiments, the first gate dielectric layer 125 is also removed and portions of the fins 110 are exposed. In some embodiments, an etch process is performed to remove the sacrificial gate electrodes 130 and the first gate dielectric layer 125. In some embodiments, the etch process is a wet etch process selective to the material of the sacrificial gate electrode 130 and the material of the first gate dielectric layer 125.

Figure 4:
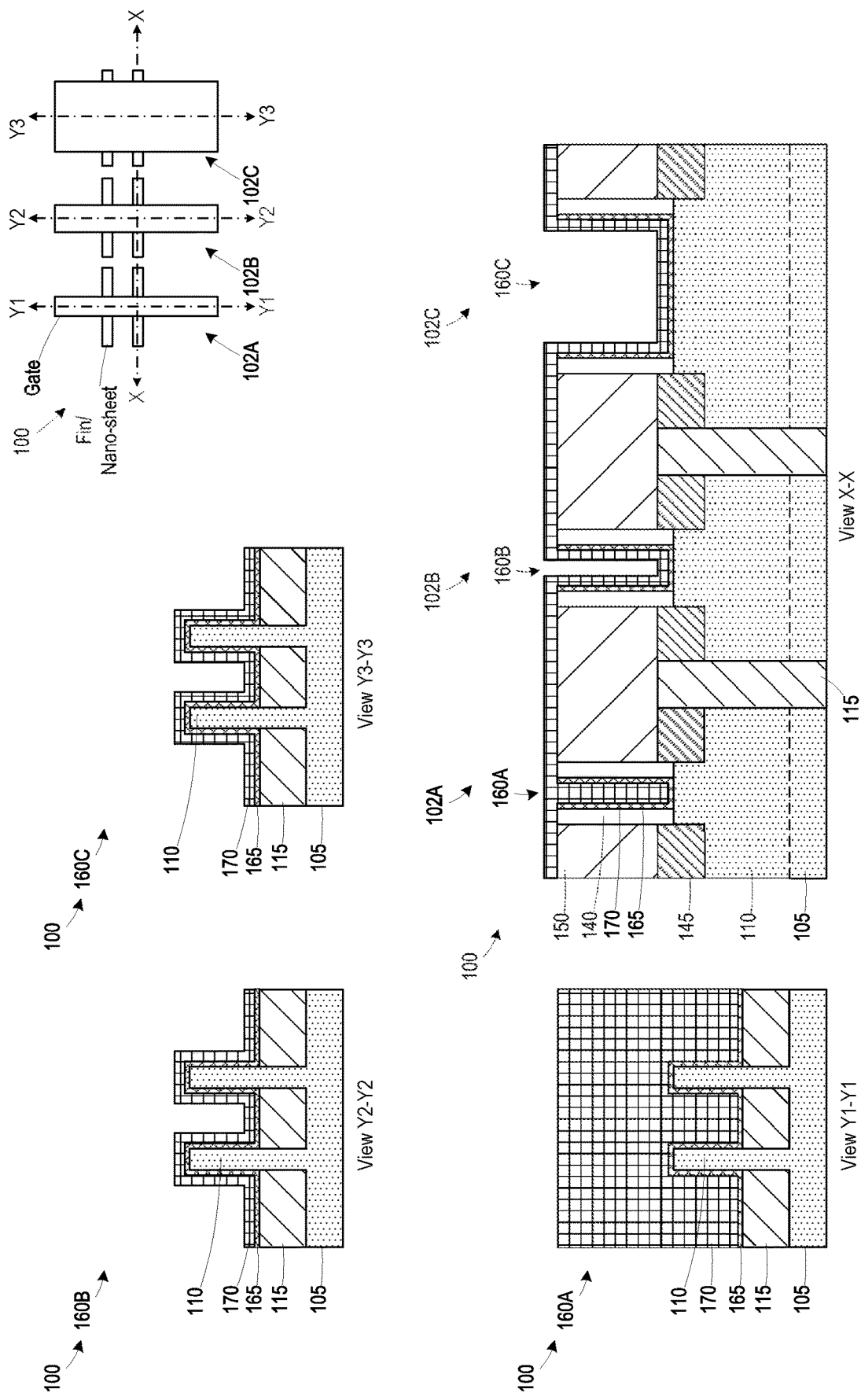
Figure 5:
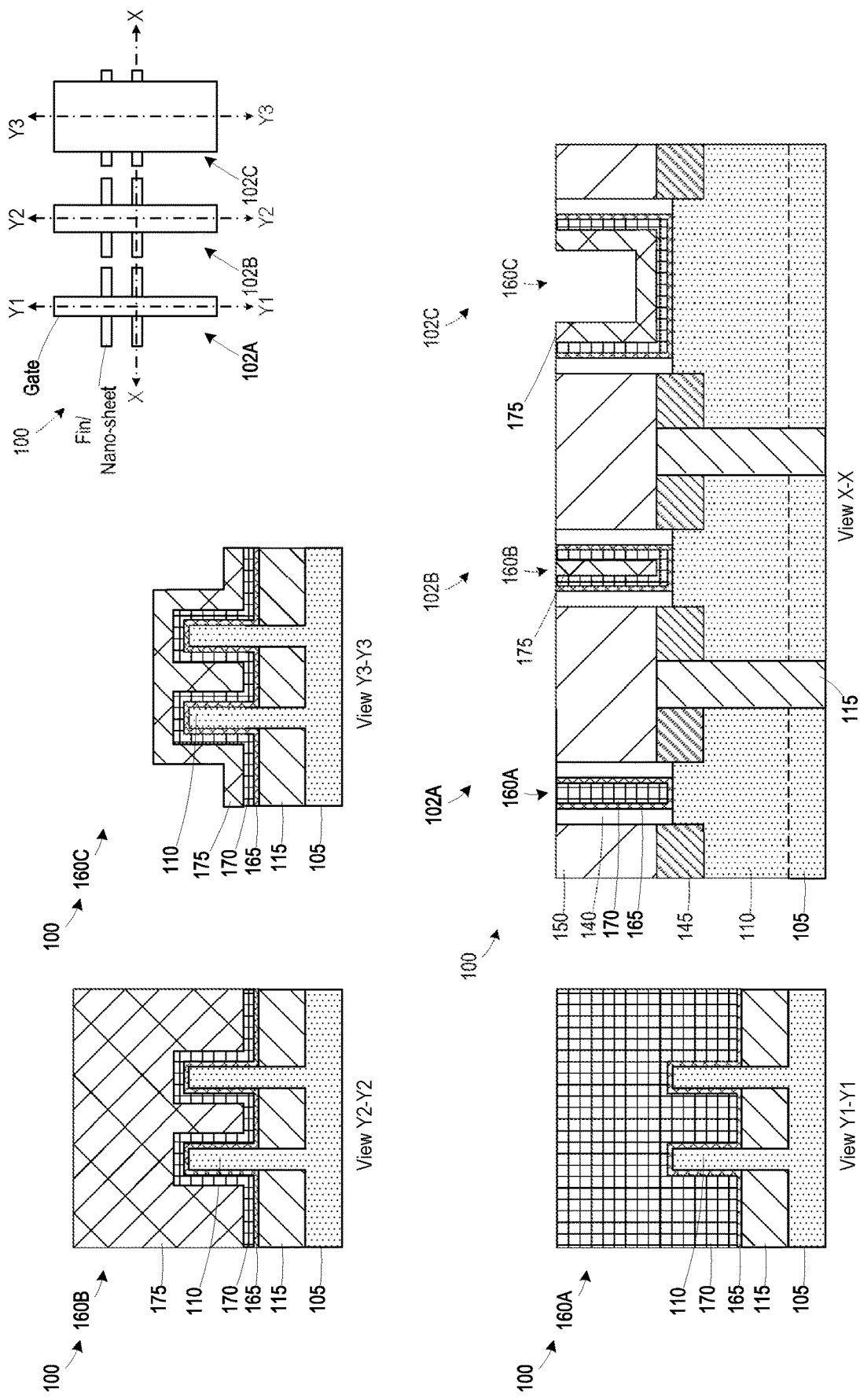
Figure 6:
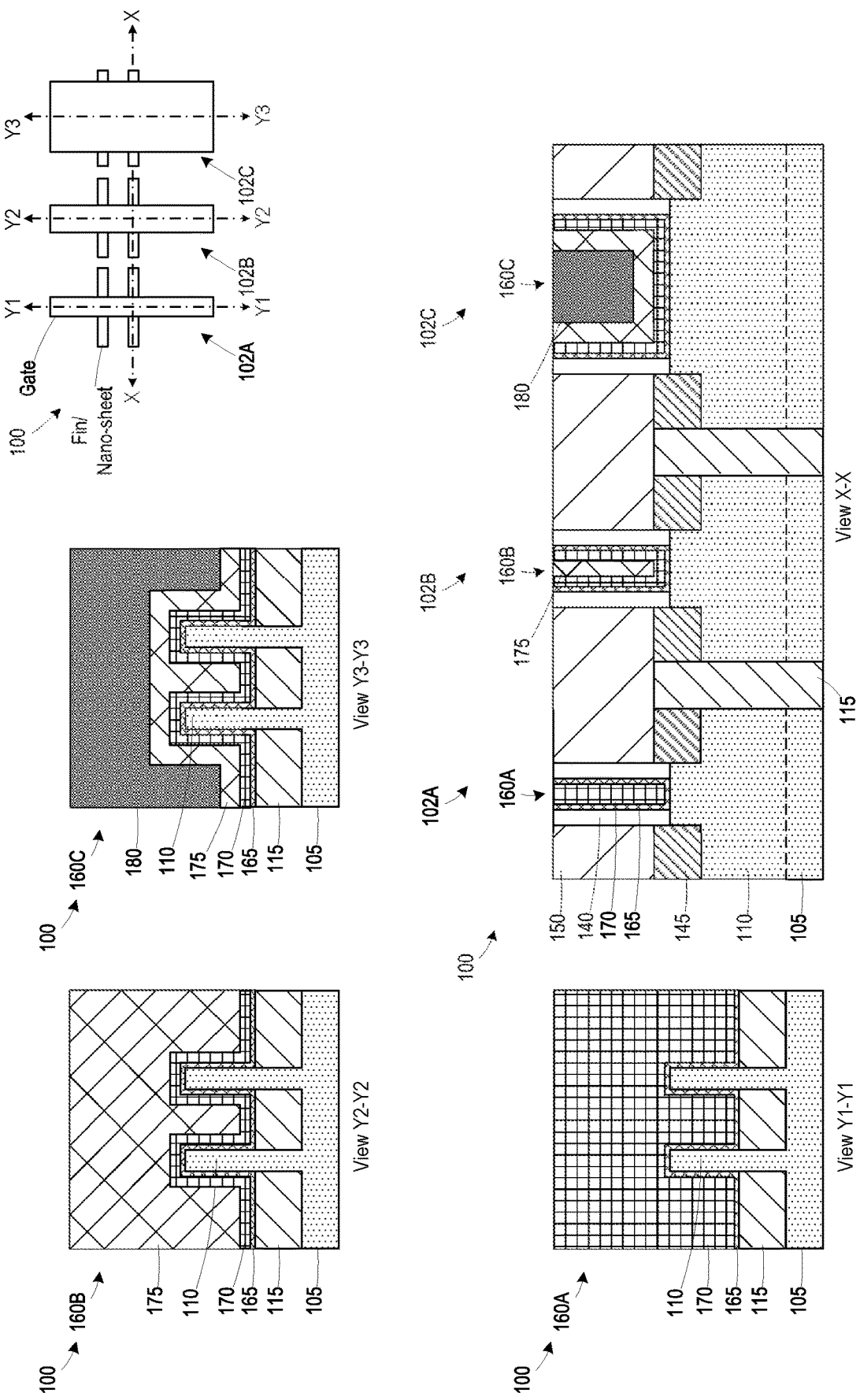

Referring to FIGS. 4-6, gate structures 160A, 160B, 160C, are formed in the gate cavities 155A, 155B, 155C, respectively, in accordance with some embodiments. In some embodiments, the gate structures 160A, 160B, 160C comprise a gate dielectric layer 165. In embodiments where the first gate dielectric layer 125 was not removed, the gate dielectric layer 165 may be the first gate dielectric layer. According to some embodiments, the gate dielectric layer 165 is deposited by at least one of ALD, PVD, CVD, or other suitable process. In some embodiments, the gate dielectric layer 165 comprises a high-k dielectric material. In some embodiments, a native oxide is present on the exposed surfaces of the fins 110 due to exposure to oxygen at various points in the process flow, and the gate dielectric layer 165 is formed over the native oxide. In some embodiments, the native oxide is removed prior to forming the gate dielectric layer 165.

In some embodiments, a work function material layer 170 is formed over the gate dielectric layer 165. According to some embodiments, the work function material layer 170 is deposited by at least one of ALD, PVD, CVD, or other suitable process. In some embodiments, the work function material layer 170 comprises a p-type work function material layer, such as at least one of TiN, TaN, Ru, Mo, Al, WN, $ZrSi_2$, $MoSi_2$, $TaSi_2$, $NiSi_2$, WN, or other suitable p-type work function materials. In some embodiments, the work function material layer 170 comprises an n-type work function metal, such as at least one of Ti, Ag, TaAl, TaAlC, TiAlN, TaC, TaCN, TaSiN, Mn, Zr, or other suitable n-type work function materials. In some embodiments, the work function material layer 170 comprises a plurality of layers.

In some embodiments, the material of the work function material layer 170 varies between regions 102A, 102B, 102C For example, the work function material layer 170 in one region 102A, 102B, 102C comprises a p-type work function metal, and the work function material layer 170 in another region 102A, 102B, 102C comprises an n-type work function material. In some embodiments, a first material of the work function material layer 170 is formed in all three regions 102A, 102B, 102C. In some embodiments, a mask layer is then formed and patterned to expose selected regions of the three regions 102A, 102B, 102C, and an etch process is performed to remove the first material of the work function material layer 170 from the selected regions of the three regions 102A, 102B, 102C. In some embodiments, the mask layer is then removed and a second material of the work function material layer 170 is formed in the selected regions of the three regions 102A, 102B, 102C and over the first material of the work function material layer 170 in the regions 102A, 102B, 102C that were not selected. In some embodiments, the second material of the work function material layer 170 is then removed from the regions that were not selected and thus still comprise the first material of the work function material layer 170 by masking the selected regions of the three regions 102A, 102B, 102C and performing an etch process to remove the second material of the work function material layer 170. In some embodiments, the second material of the work function material layer 170 remains in place over the first material of the work function material layer 170, such that both the selected regions and the regions that were not selected at least partially comprise the second material of the work function material layer 170.

In accordance with some embodiments, in regions where a length of the gate cavity is less than a first threshold length, the work function material layer 170 may pinch-off and completely fill the gate cavity. For example, referring to FIG. 3, in some embodiments, the gate cavity 155A of the first region 102A has a length 156A that is less than the first threshold length while the length 156B of the gate cavity 155B of the second region 102B and the length 156C of the gate cavity 155C are greater than or equal to the first threshold length. Referring to FIG. 4, in some embodiments, due to the length 156A of the gate cavity 155A being less than the first threshold length, the combination of the gate dielectric layer 165 and the work function material layer 170 fills the gate cavity 155A in the first region 102A. Thus, in some embodiments, the work function material layer 170 functions as the gate electrode in the first region 102A. In some embodiments, due to the length 156B of the gate cavity 155B and the length 156C of the gate cavity 155C being greater than or equal to the first threshold length, the combination of the gate dielectric layer 165 and the work function material layer 170 does not completely fill the gate cavity 155B in the second region 102B and does not completely fill the gate cavity 155C in the third region 102C.

Referring to FIG. 5, in some embodiments, a conductive fill layer 175 is formed over the work function material layer 170. According to some embodiments, the conductive fill layer 175 is deposited by at least one of ALD, PVD, CVD, electroless plating, or other suitable processes. In some embodiments, the conductive fill layer 175 is selectively grown on the work function material layer 170. In some embodiments, the conductive fill layer 175 comprises tungsten (W) or other suitable conductive material.

In some embodiments, where the work function material layer 170 does not fill the gate cavity, the conductive fill layer 175 is formed in the gate cavity over the work function material layer 170. For example, in some embodiments, the conductive fill layer 175 is formed in the gate cavity 155B in the second region 102B over the work function material layer 170 and is formed in the gate cavity 155C in the third region 102C over the work function material layer 170.

In accordance with some embodiments, in regions where a length of the gate cavity is less than a second threshold length, the conductive fill layer 175 may completely fill the gate cavity. For example, referring to FIG. 3, in some embodiments, the length 156B of the gate cavity 155B of the second region 102B is less than the second threshold length. Referring to FIG. 5, in some embodiments, due to the length 156B of the gate cavity 155B being less than the second threshold length, the combination of the gate dielectric layer 165, the work function material layer 170, and the conductive fill layer 175 completely fills the gate cavity 155B in the second region 102B. In some embodiments, due to the length 156C of the gate cavity 155C being greater than or equal to the second threshold length, the combination of the gate dielectric layer 165, the work function material layer 170, and the conductive fill layer 175 does not completely fills the gate cavity 155C in the third region 102C.

In some embodiment, deposition or growth of the conductive fill layer 175 is controlled based upon a specified gate electrode width or based upon a specified gate loading between dense regions of the semiconductor arrangement 100, such the first region 102A and the second region 102B, and less dense regions of the semiconductor arrangement 100, such as the third region 102C. For example, in some embodiments, parameters, such as time, gas composition, etc., of a growth process are controlled to stop growth of the conductive fill layer 175 upon the conductive layer achieving a specified thickness. In such embodiments, the growth of the conductive fill layer 175 is stopped prior to the conductive fill layer 175 completely filling the gate cavity 155C in the third region 102C.

According to some embodiments, a planarization process is performed to remove portions of at least one of the work function material layer 170 or the conductive fill layer 175 over the dielectric layer 150 after the conductive fill layer 175 is formed.

Referring to FIG. 6, in some embodiments, a dielectric layer 180 is formed over the conductive fill layer 175. In some embodiments, where the combination of the gate dielectric layer 165, the work function material layer 170, and the conductive fill layer 175 does not fill the gate cavity, the dielectric layer 180 is formed in the gate cavity over the conductive fill layer 175. For example, in some embodiments, the dielectric layer 180 is formed in the gate cavity 155C in the third region 102C over the conductive fill layer 175.

In some embodiments, the dielectric layer 180 comprises silicon and nitrogen. In some embodiments, the dielectric layer 180 is formed by depositing the material of the dielectric layer 180 in the gate cavity 155C and over the dielectric layer 150 after the forming of the conductive fill layer 175 and performing a planarization process to remove portions of the material of the dielectric layer 180 positioned outside the gate cavity 155C, such as portions of the material of the dielectric layer 150 over the dielectric layer 150 to expose a top surface of the dielectric layer 150. According to some embodiments, the dielectric layer 180 is deposited by at least one of ALD, PVD, CVD, or other suitable process. According to some embodiments, a planarization process does not occur after the formation of the conductive fill layer 175 and before the formation of the dielectric layer 180. In some such embodiments, a planarization process is performed to remove portions of one or more materials forming the gate structures 160A, 160B, 160C positioned over the dielectric layer 150, such as portions of at least one of the gate dielectric layer 165, the work function material layer 170, the conductive fill layer 175, or the dielectric layer 180.

According to some embodiments, the density of the particular region 102A, 102B, 102C affects the material provided in the associated gate structures 160A, 160B, 160C. In some embodiments, the region 102A comprises a high density region, and the gate cavity 155A is filled after the formation of the gate dielectric layer 165 and the work function material layer 170. In some embodiments, the region 102B is a medium density region, and the gate cavity 155B is filled after formation of the gate dielectric layer 165, the work function material layer 170, and the conductive fill layer 175. In some embodiments, the region 102C is a low density region, and the gate cavity 155C is not filled after formation of the gate dielectric layer 165, the work function material layer 170, and the conductive fill layer 175. According to some embodiments, the remaining portion of the gate cavity 155C is filled with the dielectric layer 180 to reduce the likelihood of dishing that is possible with planarization processes performed over low density metal features, such as the planarization process described above for removing portions of the material forming the gate structures 160A, 160B, 160C that is positioned over the dielectric layer 150. In some embodiments, the remaining portion of the gate cavity 155C is filled with the dielectric layer 180 to at least one of control the formation of a polymer layer 190 during a material modification phase 600 or control removal of the conductive fill layer 175 during a material removal phase 605 of a cyclic etch process, as described with respect to FIGS. 7-12, such that merely an uppermost portion of the conductive fill layer 175 is removed during each cycle of the cyclic etch process.

Figure 7:
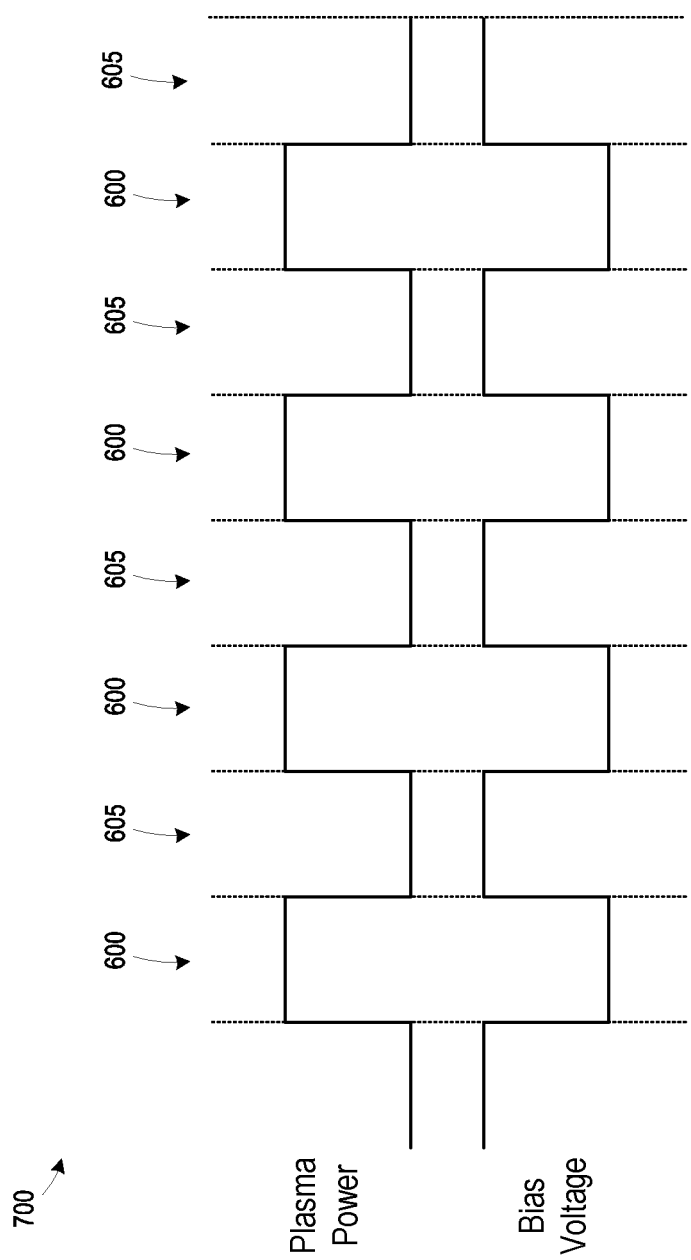
FIG. 7 is a timing diagram of a cyclic etch process, in accordance with some embodiments.
Figure 9:
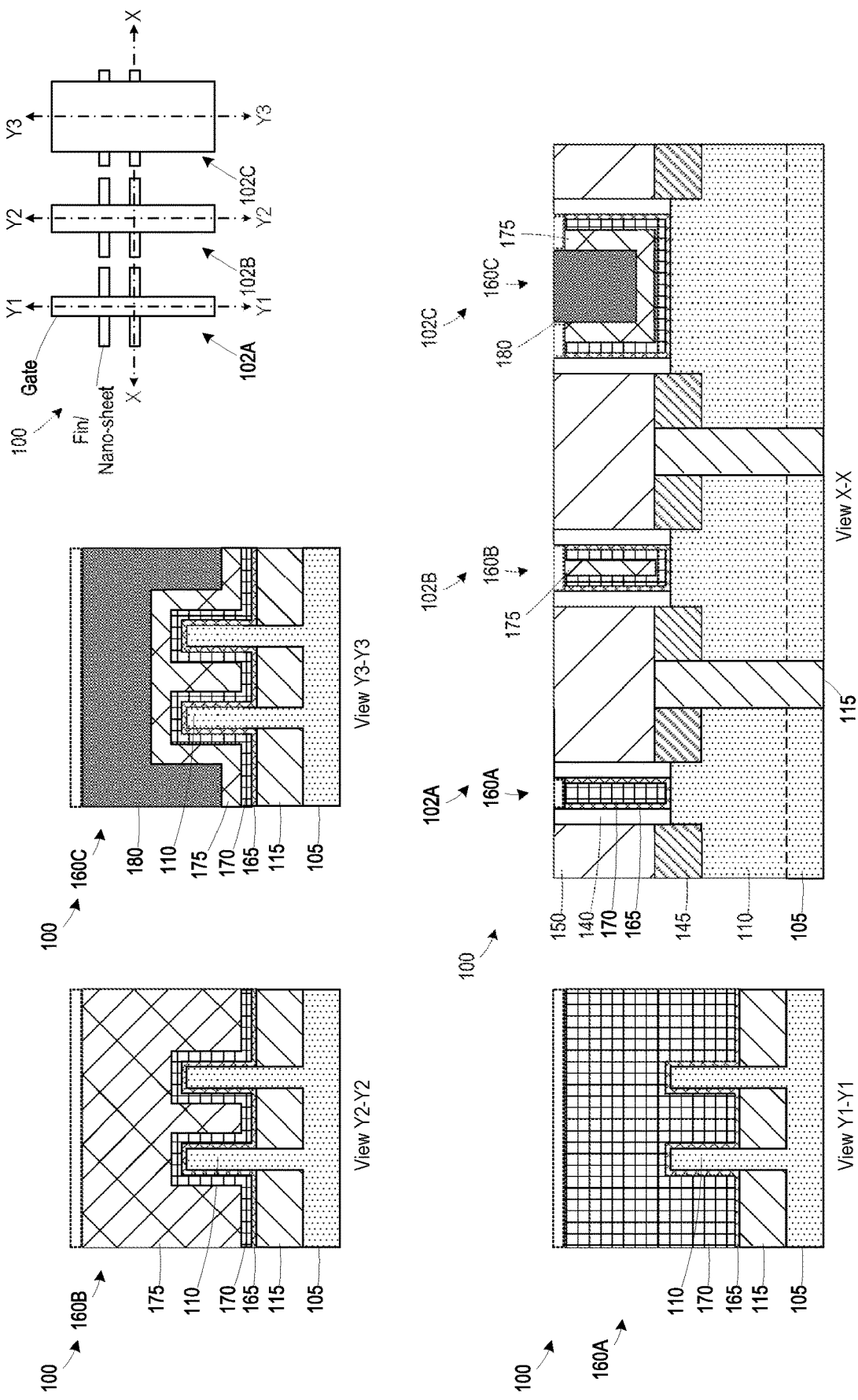

Referring to FIGS. 7-9, a cyclic etch process is performed to recess portions of the gate structures 160A, 160B, 160C. FIG. 7 is a timing diagram 700 illustrating the process conditions for the cyclic etch process, in accordance with some embodiments. In some embodiments, the cyclic etch process comprises an inductively coupled plasma (ICP) process. As seen in FIG. 7, the cyclic etch process comprises material modification phases 600 and material removal phases 605, in accordance with some embodiments. In some embodiments, a plasma power parameter and a bias voltage parameter are modulated in the cyclic etch process between the material modification phase 600 and the material removal phase 605. In some embodiments, the plasma power is high and the bias voltage is low during the material modification phase 600. In some embodiments, the plasma power is low and the bias voltage is high during the material removal phase 605. In some embodiments, a high plasma power is between about 1000-3000 W, and a low plasma power is between about 300-500 W. In some embodiments, a high bias voltage is between about 500-1500 V, and a low bias voltage is between about 0-100 V.

In some embodiments, the period for each cycle of the cyclic etch process is selected according to a specified depth of material of the gate structures 160A, 160B, and 160C to be removed during the cycle. For example, in some embodiments, the depth of material to be removed during a cycle is between 0.1 nm and 1 nm, and the period is selected to be about 8 to 10 seconds. In some embodiments, the depth of material to be removed during a cycle is between 1 nm and 6 nm, and the period is selected to be about 10 to 20 seconds. In some embodiments, the time intervals are the same for the material modification phase 600 and the material removal phase 605, as illustrated in FIG. 7. In some embodiments, the time intervals for the material modification phase 600 and the material removal phase 605 are asymmetric in that the time interval for the material modification phase 600 is different than the time interval for the material removal phase 605. In some embodiments, the time intervals change over the course of the cyclic etch process. For example, the time intervals for the material modification phase 600 and the material removal phase 605 may be longer during an initial portion of the cyclic etch process as compared to a latter portion of the cyclic etch process.

In some embodiments, the same process gas mixture is used for the material modification phase 600 and the material removal phase 605. In some embodiments, the process gas mixture comprises at least one of chlorine, boron, argon, oxygen, hydrogen, carbon, fluorine, nitrogen, or helium. In some embodiments, the process gas mixture comprises at least one of $BCl_3$, $CF_4$, $C_2F_4$, $C_2F_6$, other fluorocarbon, or other fluorine-based gas. In some embodiments where the process gas mixture comprises chlorine, the flow rate of chlorine is between about 0-130 sccm. In some embodiments where the process gas mixture comprises boron trichloride ($BCl_3$), the flow rate of $BCl_3$ is between about 100-200 sccm. In some embodiments where the process gas mixture comprises argon, the flow rate of argon is between about 30-100 sccm. In some embodiments where the process gas mixture comprises oxygen, the flow rate of oxygen is between about 0-10 sccm. In some embodiments where the process gas mixture comprises hydrogen, the flow rate of hydrogen is between about 30-60 sccm. In some embodiments, where the process gas mixture comprises a combination of $BCl_3$, $H_2$, and Ar an atomic weight ratio of $BCl_3:H_2:Ar$ is about 100-130:0.5-3.5:30-50 or about 115:2:40.

Referring to FIG. 8, a polymer layer 190 is formed over the dielectric layer 150 and top portions of the work function material layer 170 are modified to define modified portions 170M during the material modification phase 600, according to some embodiments. In some embodiments where the process gas mixture comprises $BCl_3$, the $BCl_3$ in the process gas mixture reacts in the ambient plasma under the high plasma power and low bias voltage conditions to form the polymer layer 190 and chlorine. In some embodiments, the polymer layer 190 comprises $BCl_x$. In some embodiments, the thickness of the polymer layer 190 is determined based on the time interval of the material modification phase 600.

In some embodiments, the thickness of the polymer layer 190 is selected based upon the thickness of the work function material layer 170 to be removed during a cycle of the cyclic etch process. For example, in some embodiments, a cycle is configured to modify about 0.1 nm to about 1 nm of the work function material layer 170, and the process is controlled such that the polymer layer 190 is formed to have a thickness of about 0.05 nm to about 5 nm or about 0.1 nm to about 3 nm so that sufficient polymer material for modification of about 0.1 nm to about 1 nm of the work function material layer 170 while not being so thick as to result in more than 1 nm of the work function material layer 170 being modified during the material modification phase 600. In some embodiments, the thickness of the polymer layer 190 is modulated by the concentration of hydrogen in the process gas mixture. In some embodiments, H dissociates from $H_2$ in the process gas mixture and consumes Cl. A higher hydrogen concentration results in increased chlorine consumption, which increases the production rate of the polymer material, resulting in a thicker polymer layer 190 for a given time interval.

In some embodiments, the polymer layer 190 and chlorine in the process gas mixture reacts with the material of the work function material layer 170 to form the modified portions 170M during the material modification phase 600 under the high plasma power and low bias voltage conditions. In some embodiments, the polymer layer 190 does not modify the materials of the sidewall spacers 140, the dielectric layers 150, 165, 180, or the conductive fill layer 175. In some embodiments, where the work function material layer 170 comprises titanium nitride, TiN, the modified portions 170M comprise titanium, chlorine, and nitrogen. According to some embodiments, the presence of the chlorine in the modified portions 170M changes the etch selectivity of the modified portions 170M relative to the work function material layer 170.

Referring to FIG. 9, the polymer layer 190 and the modified portions 170M of the work function material layer 170 are removed during the material removal phase 605, in accordance with some embodiments. In some embodiments, an etch process is performed to remove the modified portions 170M of the work function material layer 170. In some embodiments, argon is the main etch contributor in the process gas mixture under the low plasma power and high bias voltage conditions of the material removal phase 605. In some embodiments, as the modified portions 170M of the work function material layer 170 are removed, portions of the gate dielectric layer 165 and the conductive fill layer 175 are exposed. In some embodiments, chlorine in the process gas mixture etches the exposed portions of the gate dielectric layer 165, resulting in the concurrent recessing of the modified portions 170M of the work function material layer 170 and the gate dielectric layer 165. In some embodiments, oxygen and chlorine in the process gas mixture oxidize and etch the material of the conductive fill layer 175 to recess the conductive fill layer 175 concurrently with the removal of the modified portions 170M of the work function material layer 170.

Referring to FIGS. 10 and 11, the material modification phase 600 of FIG. 8 and the material removal phase 605 of FIG. 9 are repeated in a cyclic fashion, in accordance with some embodiments, to remove additional portions of the work function material layer 170, the gate dielectric layer 165, and the conductive fill layer 175. In some embodiments, the material modification phase 600 of FIGS. 8 and 10 and the material removal phase 605 of FIGS. 9 and 11 are repeated in a cyclic fashion until stopping criteria is satisfied. For example, the material modification phase 600 and the material removal phase 605 may be repeated until the work function material layer 170 has a specified height, measured from a bottommost surface of the work function material layer 170 to an uppermost surface of the work function material layer 170. As another example, the material modification phase 600 and the material removal phase 605 may be repeated until the conductive fill layer 175 has a specified height, measured from a bottommost surface of the conductive fill layer 175 to an uppermost surface of the conductive fill layer 175. As another example, the material modification phase 600 and the material removal phase 605 may be repeated until a specified number of cycles have occurred. According to some embodiments, the number of cycles varies depending on the dimensions of the gate structures 160A, 160B, 160C. In some embodiments, the number of cycles in the cyclic etch process is about 10 to 30 depending on the etching depth.

The cyclic etch process described with reference to FIGS. 7-11 allows the same process gas mixture to be used throughout the process, in accordance with some embodiments. In some embodiments, the material modification phase 600 and the material removal phase 605 are differentiated by the plasma power and bias voltage levels. It contrast to multiple step etch approaches that employ different process gases for each step, throughput is increased since stabilization periods are not required between steps. The cyclic process, using a thin polymer layer 190 and repeated cycles, reduces etch loading due to the different densities of the regions 102A, 102B, 102C. In some embodiments, since the material modification phase 600 does not modify the materials of the sidewall spacers 140 and the dielectric layers 150, 165, 180, erosion of the gate structures 160A, 160B, 160C is reduced, causing a reduction in gate height loss.

Figure 12:
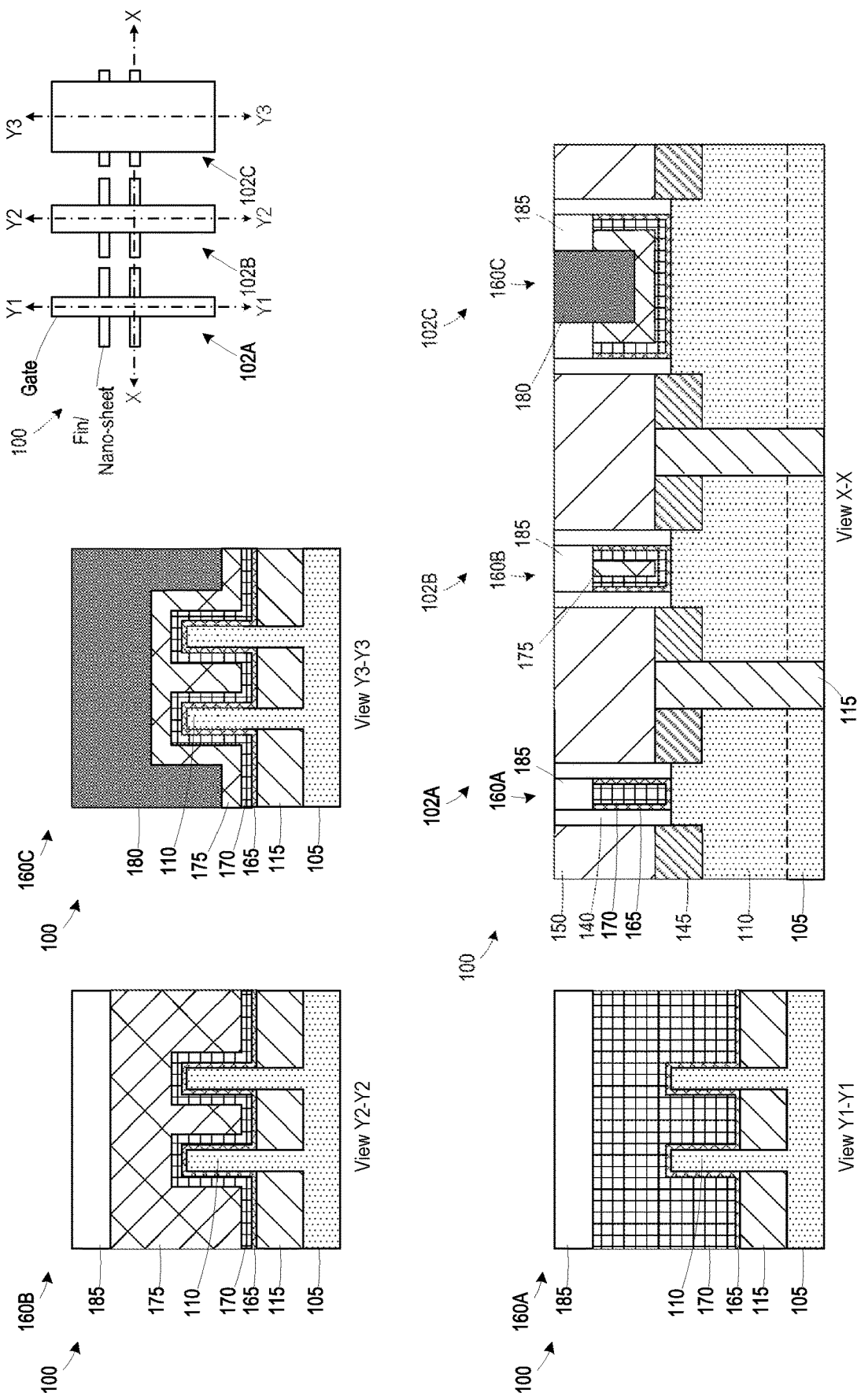

Referring to FIG. 12, after the cyclic etch process is complete, a dielectric layer 185 is formed using a deposition process, in accordance with some embodiments. In some embodiments, the dielectric layer 185 comprises silicon and nitrogen, silicon and oxygen, or other suitable materials. In some embodiments, the dielectric layer 185 has a same material composition as the dielectric layer 180. In some embodiments, a material composition of the dielectric layer 185 is different than a material composition of the dielectric layer 180.

In some embodiments, the dielectric layer 185 is formed by depositing a material of the dielectric layer 185 in the recesses created by the cyclic etch process and over the dielectric layer 150. In some embodiments, a planarization process is performed to remove portions of the material of the dielectric layer 185 positioned outside the recesses. In some embodiments, metal layers, dielectric layers, or contacts are formed over or through at least one of the dielectric layer 185, the dielectric layer 180, or the dielectric layer 150 to provide power or a conductive pathway to at least one of the source/drain regions 145 or the gate electrodes of the gate structures 160A, 160B, 160C after forming the dielectric layer 185.

Figure 13:
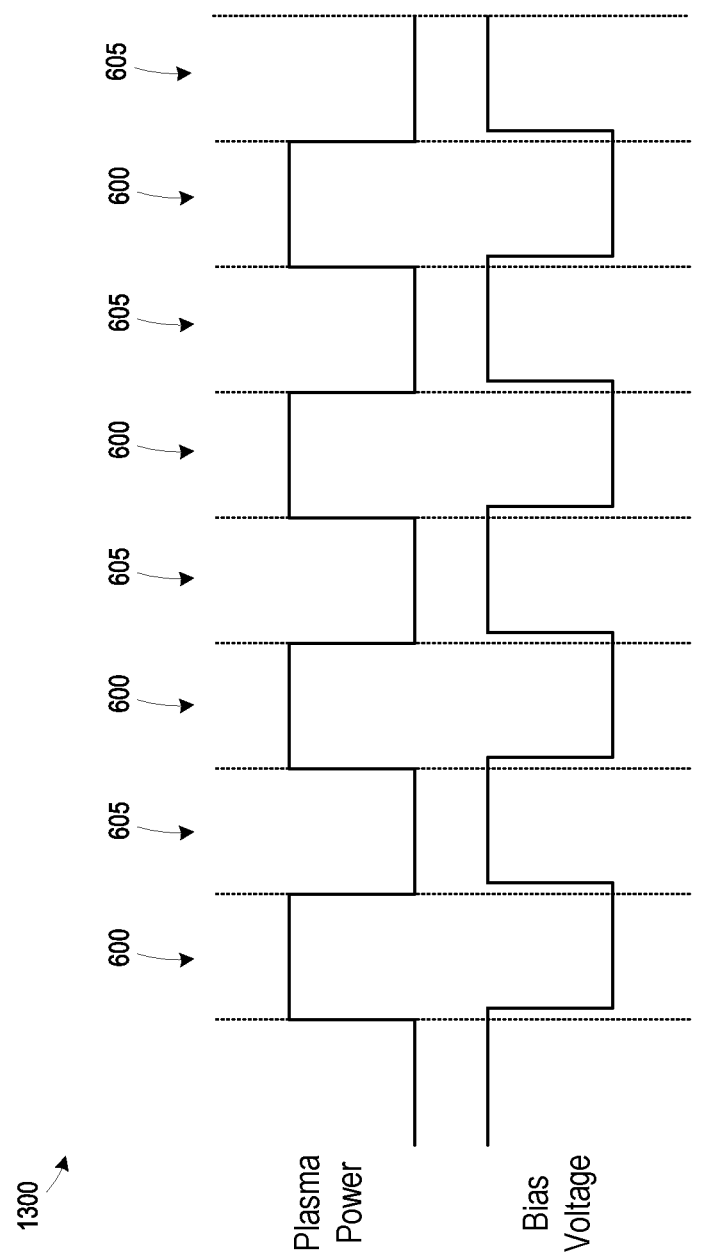
FIG. 13 is a timing diagram of a cyclic etch process, in accordance with some embodiments.

Although FIG. 7 illustrates a timing diagram 700 in which the plasma power and the bias voltage are inversely, simultaneously controlled and in which the period remains constant throughout the cyclic etch process, as previously described, other timing scenarios are contemplated. For example, referring to FIG. 13, a timing diagram 1300 illustrating the process conditions for the cyclic etch process is provided, in accordance with some embodiments. In some embodiments, a ramp-down of the bias voltage may be offset or delayed relative to a ramp-up of the plasma power during the material modification phase 600 so as to facilitate or ensure that the plasma power is high prior to the bias voltage going low. In some embodiments, a ramp-up of the bias voltage may be offset or delayed relative to a ramp-down of the plasma power during the material removal phase 605 or to facilitate or ensure that the plasma power is low prior to the bias voltage going high.

As another example, referring to FIG. 14, a timing diagram 1400 illustrating the process conditions for the cyclic etch process is provided, in accordance with some embodiments. In some embodiments, a duration of the material modification phases 600 during one or more cycles is different than a duration of the material removal phase 605 during the same one or more cycles. For example, in some embodiments, the material modification phases 600 during one or more cycles are longer than the corresponding material removal phases 605 as illustrated in the timing diagram 1400. In some embodiments, the material modification phases 600 during one or more cycles are shorter than the corresponding material removal phases 605.

As another example, referring to FIG. 15 a timing diagram 1500 illustrating the process conditions for the cyclic etch process is provided, in accordance with some embodiments. In some embodiments, periods of cycles are greater during a beginning of the cyclic etch process to enable course removal of the work function material layer 170, the gate dielectric layer 165, and the conductive fill layer 175, and the periods of cycles decrease as the cyclic etch process proceeds to enable more fine-tuning of the removal of the work function material layer 170, the gate dielectric layer 165, and the conductive fill layer 175 and to better control the removal rate. In some embodiments, the period of each cycle is shortened relative to the immediately previous cycle. In some embodiments, the periods of cycles are intermittently shortened. In some embodiments, the periods of the cycles are linearly changed, exponentially charged, or other changed according to a specified pattern.

Although the aforementioned timing diagrams illustrate the ramp-up and ramp-down of the plasma power as being ideal and the ramp-up and ramp-down of the bias power as being ideal, in some embodiments, at least one of the ramp-up of the plasma power, the ramp-down of the plasma power, the ramp-up of the bias power, or the ramp-down of the bias power is not ideal, and therefore at least one of the plasma power or the bias power may go through a transitional phase during which the power is transitioning from low to high during a ramp-up or a transitional phase during which the power is transitioning from high to low during a ramp-down.

According to some embodiments, a method for forming a semiconductor arrangement includes forming a first gate structure over a first active region. The first gate structure includes a first gate dielectric layer and a first conductive layer over the first gate dielectric layer. A cyclic etch process is performed using a process gas mixture to recess the first gate structure and define a recess. The cyclic etch process includes a first phase to form a polymer layer over the first conductive layer and to modify a portion of the first conductive layer to form a modified portion of the first conductive layer and a second phase to remove the polymer layer and to remove the modified portion of the first conductive layer. A first cap layer is formed over the first gate structure in the recess.

According to some embodiments, a method for forming a semiconductor arrangement includes forming a first gate structure having a first gate length dimension over a first active region. The first gate structure includes a first gate dielectric layer and a first work function material layer over the first gate dielectric layer. A second gate structure having a second gate length dimension greater than the first gate length dimension is formed over a second active region. The second gate structure includes a second gate dielectric layer, a second work function material over the second gate dielectric layer, and a conductive fill layer over the second work function material layer. A cyclic etch process is performed using a process gas mixture to recess the first gate structure to define a first recess and to recess the second gate structure to define a second recess. The cyclic etch process includes a first phase to form a polymer layer over the first gate structure and the second gate structure and to modify a first portion of the first work function material layer to form a modified first portion and a second portion of the second work function material layer to form a second modified portion and a second phase to remove the polymer layer and to remove the modified first portion and the modified second portion. A cap layer is formed in the first recess and the second recess.

According to some embodiments, a method for forming a semiconductor arrangement includes forming a first conductive layer. The first conductive layer is recessed to define a recess. The recessing includes performing a first plasma process using a first plasma power and a first bias voltage to modify a portion of the first conductive layer to form a modified portion of the first conductive layer. A second plasma process is performed using a second plasma power lower than the first plasma power and a second bias voltage greater than the first bias voltage to remove the modified portion of the first conductive layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor arrangement, comprising:
    forming a first gate structure over a first active region, wherein the first gate structure comprises a first gate dielectric layer and a first conductive layer over the first gate dielectric layer;
    performing a cyclic etch process using a process gas mixture to recess the first gate structure and define a recess, the cyclic etch process comprising a first phase to form a polymer layer over the first conductive layer and to modify a portion of the first conductive layer to form a modified portion of the first conductive layer including changing a material composition of the portion of the first conductive layer and a second phase to remove the polymer layer and to remove the modified portion of the first conductive layer; and
    forming a first cap layer over the first gate structure in the recess.

2. The method of claim 1, wherein the first phase comprises a first plasma process performed using a first plasma power, and the second phase comprises a second plasma process using a second plasma power lower than the first plasma power.

3. The method of claim 2, wherein the first plasma process is performed using a first bias voltage, and the second plasma process is performed using a second bias voltage greater than the first bias voltage.

4. The method of claim 1, wherein the first phase comprises a first plasma process performed using a first bias voltage, and the second phase comprises a second plasma process performed using a second bias voltage greater than the first bias voltage.

5. The method of claim 1, wherein the process gas mixture comprises argon, boron trichloride and chlorine, the boron trichloride reacts during the first phase to form the polymer layer, the chlorine and the polymer layer modify the portion of the first conductive layer, and the argon etches the modified portion of the first conductive layer during the second phase.

6. The method of claim 5, wherein the chlorine etches a portion of the first gate dielectric layer exposed by removal of the modified portion of the first conductive layer.

7. The method of claim 1, wherein the first conductive layer comprises a work function material and the first gate structure comprises a conductive fill material over the work function material.

8. The method of claim 7, wherein a component of the process gas mixture etches a portion of the conductive fill material exposed by removal of the modified portion of the first conductive layer.

9. The method of claim 8, wherein the component comprises oxygen.

10. A method for forming a semiconductor arrangement, comprising:
    forming a first gate structure having a first gate length dimension over a first active region, wherein the first gate structure comprises a first gate dielectric layer and a first work function material layer over the first gate dielectric layer;
    forming a second gate structure having a second gate length dimension greater than the first gate length dimension over a second active region, wherein the second gate structure comprises a second gate dielectric layer, a second work function material layer over the second gate dielectric layer, and a conductive fill layer over the second work function material layer;
    performing a cyclic etch process using a process gas mixture to recess the first gate structure to define a first recess and to recess the second gate structure to define a second recess, the cyclic etch process comprising a first phase to form a polymer layer over the first gate structure and the second gate structure and to modify a first portion of the first work function material layer to form a modified first portion including changing a material composition of the first portion of the first work function material layer and a second portion of the second work function material layer to form a modified second portion and a second phase to remove the polymer layer and to remove the modified first portion and the modified second portion; and
    forming a cap layer in the first recess and the second recess.

11. The method of claim 10, wherein the first phase comprises a first plasma process performed using a first plasma power, and the second phase comprises a second plasma process using a second plasma power lower than the first plasma power.

12. The method of claim 11, wherein the first plasma process is performed using a first bias voltage, and the second plasma process is performed using a second bias voltage greater than the first bias voltage.

13. The method of claim 10, wherein the process gas mixture comprises argon, boron trichloride and chlorine, the boron trichloride reacts during the first phase to form the polymer layer, the chlorine and the polymer layer modify the first portion of the first work function material layer and the second portion of the second work function material layer, and the argon etches the modified first portion and the modified second portion during the second phase.

14. The method of claim 13, wherein the chlorine etches portions of the first gate dielectric layer exposed by removal of the modified first portion and etches portions of the second gate dielectric layer exposed by removal of the modified second portion.

15. The method of claim 10, wherein a component of the process gas mixture etches a portion of the conductive fill layer exposed by removal of the modified second portion.

16. The method of claim 15, wherein the component comprises oxygen.

17. The method of claim 10, wherein the second gate structure comprises a dielectric layer positioned between sidewall portions of the second work function material layer.

18. A method for forming a semiconductor arrangement, comprising:
    forming a first conductive layer; and
    recessing the first conductive layer to define a recess, the recessing comprising:
        performing a first plasma process using a first plasma power and a first bias voltage to modify a portion of the first conductive layer to form a modified portion of the first conductive layer including changing a material composition of the portion of the first conductive layer; and
        performing a second plasma process performed using a second plasma power lower than the first plasma power and a second bias voltage greater than the first bias voltage to remove the modified portion of the first conductive layer.

19. The method of claim 18, wherein a process gas mixture is used during the first plasma process and the second plasma process, the process gas mixture comprising at least one of argon, boron trichloride, or chlorine.

20. The method of claim 18, comprising forming a first cap layer over the first conductive layer in the recess.

* * * * *